(12) United States Patent
Hunt et al.

(10) Patent No.: US 11,681,837 B2
(45) Date of Patent: Jun. 20, 2023

(54) 3D BLOCK MODELLING OF A RESOURCE BOUNDARY IN A POST-BLAST MUCKPILE TO OPTIMIZE DESTINATION DELINEATION

(71) Applicant: ORICA USA INC., Watkins, CO (US)

(72) Inventors: Timothy William Hunt, Denver, CO (US); David Mario La Rosa, Brisbane (AU); Jeffrey Scott Seaman, Santa Monica, CA (US)

(*) Notice: Subject to any disclaimer, the term of this patent is extended or adjusted under 35 U.S.C. 154(b) by 951 days.

(21) Appl. No.: 16/365,130

(22) Filed: Mar. 26, 2019

(65) Prior Publication Data
US 2020/0089823 A1    Mar. 19, 2020

Related U.S. Application Data

(60) Provisional application No. 62/648,291, filed on Mar. 26, 2018.

(51) Int. Cl.
*G06F 30/20* (2020.01)
*G01V 99/00* (2009.01)
(Continued)

(52) U.S. Cl.
CPC ............ *G06F 30/20* (2020.01); *G01V 99/005* (2013.01); *G01C 11/04* (2013.01); *G01C 15/002* (2013.01); *G01S 17/42* (2013.01); *G01S 19/14* (2013.01)

(58) Field of Classification Search
CPC ............... G06F 30/20; G01V 99/005
(Continued)

(56) References Cited

U.S. PATENT DOCUMENTS

| 3,735,704 | A | * | 5/1973 | Livingston | .............. E21C 41/31 |
| | | | | | 102/301 |
| 3,848,927 | A | * | 11/1974 | Livingston | .............. E21C 41/32 |
| | | | | | 299/13 |

(Continued)

FOREIGN PATENT DOCUMENTS

| AU | 2019202048 A1 | * | 10/2019 | ........... G01V 99/005 |
| CA | WO2008141465 A1 | | 11/2008 | |

(Continued)

OTHER PUBLICATIONS

La Rosa et al. ("Blast Movement Modelling and Measurement", 35th APCOM Symposium , 2011, pp. 297-309) (Year: 2011).*

(Continued)

*Primary Examiner* — Iftekhar A Khan
(74) *Attorney, Agent, or Firm* — Reilly Intellectual Property Law Firm

(57) ABSTRACT

A method for 3-D block modelling of a resource boundary in a post-blast muckpile to optimize destination delineation for resource control is provided. An in-situ pre-blast model of an ore deposit to be mined, movement data, blast design and explosive loading information, and post-blast topographic data are input in to the memory of a general purpose computer. Using the pre-blast block model, movement data, blast design and explosive loading information, and post-blast topographic data a three-dimensional vector field is generated. The method uses the three-dimensional vector field to move a plurality of centroids of the in-situ block model to populate a three-dimensional post-blast location. Then method optimizes the populated three dimensional post-blast location to determine a plurality of sets of optimal dig boundaries.

20 Claims, 12 Drawing Sheets

(51) Int. Cl.
*G01S 19/14* (2010.01)
*G01S 17/42* (2006.01)
*G01C 15/00* (2006.01)
*G01C 11/04* (2006.01)

(58) Field of Classification Search
USPC .......................................................... 703/6
See application file for complete search history.

(56) References Cited

U.S. PATENT DOCUMENTS

| | | | | |
|---|---|---|---|---|
| 4,602,215 | A * | 7/1986 | Ryaboshtan | G01V 3/12 324/334 |
| 5,430,953 | A * | 7/1995 | de Souza | G01B 7/004 33/787 |
| 6,062,085 | A * | 5/2000 | Song | G01H 1/12 73/866.5 |
| 7,367,269 | B2 * | 5/2008 | La Rosa | E21B 47/02 73/35.14 |
| 7,490,507 | B2 * | 2/2009 | La Rosa | E21C 41/26 73/35.14 |
| 7,891,233 | B2 * | 2/2011 | Thornton | E21C 41/26 73/35.14 |
| 8,398,175 | B2 * | 3/2013 | Spathis | F42D 3/04 299/13 |
| 8,955,916 | B2 * | 2/2015 | Spathis | F42D 3/04 299/1.05 |
| 10,123,157 | B2 * | 11/2018 | Appleby | G01V 1/30 |
| 10,520,642 | B2 * | 12/2019 | Wortley | G01V 1/184 |
| 10,837,750 | B2 * | 11/2020 | Averett | F42D 3/04 |
| 2003/0001775 | A1 * | 1/2003 | Turner | G01S 5/0027 342/463 |
| 2004/0159258 | A1 * | 8/2004 | Brent | F42D 1/00 102/311 |
| 2005/0012499 | A1 * | 1/2005 | La Rosa | E21B 47/02 324/207.15 |
| 2007/0151345 | A1 * | 7/2007 | Thornton | E21C 39/00 73/649 |
| 2007/0169542 | A1 * | 7/2007 | Thornton | E21B 47/02 73/35.14 |
| 2007/0272110 | A1 * | 11/2007 | Brent | F42D 1/055 102/313 |
| 2010/0225155 | A1 * | 9/2010 | Spathis | E21C 37/00 299/13 |
| 2014/0379304 | A1 * | 12/2014 | Anderson | G01N 29/46 702/190 |
| 2015/0155637 | A1 * | 6/2015 | Kuiper | G01S 11/06 324/629 |
| 2015/0281881 | A1 * | 10/2015 | Appleby | H04W 4/029 715/848 |
| 2017/0315264 | A1 * | 11/2017 | Wortley | G01V 1/184 |
| 2018/0179648 | A1 * | 6/2018 | Thompson | C25B 1/00 |
| 2018/0279020 | A1 * | 9/2018 | Kuiper | H04Q 9/00 |
| 2019/0257197 | A1 * | 8/2019 | Palmer | E21B 49/005 |
| 2020/0356929 | A1 * | 11/2020 | Vasey | G06Q 50/02 |

FOREIGN PATENT DOCUMENTS

| | | | |
|---|---|---|---|
| CN | 110197318 A * | 9/2019 | |
| WO | WO-2008122068 A1 * | 10/2008 | ............ E21F 13/04 |
| WO | WO2013181720 A1 | 12/2013 | |
| WO | WO2016077889 B2 | 5/2016 | |
| WO | WO2018058038 A1 | 3/2018 | |

OTHER PUBLICATIONS

Travis James Kassebaum ("Using LiDAR as a monitoring device to calculate volume of rockfall over time", Missouri University of Science and Technology, 2012, pp. 1-68) (Year: 2012).*

Matthew Deutsch ("A Branch and Bound Algorithm for Open Pit Grade Control Polygon Optimization", APCOM Conference 2017, pp. 1-8) (Year: 2017).*

D Thornton (The Implications of Blast-Induced Movement to Grade Control, Seventh International Mining Geology Conference, 2009, pp. 1-8) (Year: 2009).*

Singh et al. (Factors Governing the Muck Pile Characteristics, 2017, International Society of Explosives Engineers, pp. 1-14) (Year: 2017).*

* cited by examiner

3D BLOCK MODELLING OF A RESOURCE BOUNDARY IN A POST-BLAST MUCKPILE TO OPTIMIZE DESTINATION DELINEATION

This application claims the benefit of U.S. Provisional Application No. 62/648,291 filed Mar. 26, 2018 for 3D BLOCK MODELLING OF AN ORE BOUNDARY IN A POST-BLAST MUCKPILE TO OPTIMIZE DIG LINES and is incorporated by reference herein.

BACKGROUND

The present method relates to optimization of destination delineation in a post blast muckpile. In particular, it relates to a 3D modeling of post-blast ore grade boundaries to optimize the location of grade control polygons.

The surface mining industry is primarily comprised of industrial minerals (aggregates, cement, etc), coal, and precious and base metals. This business serves the precious and base metals markets which produce minerals, including, but not limited to, copper, iron, PGMs, gold, silver, zinc, nickel, and rare earth elements.

In open pit mines, a bench blasting method is often used to allow the removal of a determined volume of a given rock mass. These mine deposits are highly heterogeneous with the resource, such as ore, disseminated in pockets of varying grade with an economic cut-off grade determined for the mine operation and as such, any material with less mineralization may be designated as waste or sent to leach pads for additional extraction. The ore is excavated and hauled to the mineral processing plant while the waste is transported to a suitable dumping location. Blasting of these rocks involves drilling a series of holes with a calculated spacing-burden ratio necessary to fragment and loosen the rock mass. However, the movement of the rock caused by blasting has an unfavorable effect on the separation of the ore and waste region in the muck pile, causing either ore loss (the ore is wrongly categorized as waste and sent to the waste dump) and/or ore dilution (waste is wrongly categorized as ore and sent to the processing plant). The dilution or loss of mineral are two important factors in grade control of a mine. Misclassification can also occur, where ore is sent to an incorrect processing destination or stockpile.

Large companies are realizing that investment in operational efficiency and optimized processes are the difference between surviving and thriving. Large, easy-to-mine deposits are gone, and new innovative solutions are required to keep mines profitable.

The generally accepted prior art practice of ore control, for example, is accomplished through the horizontal translation of 2D in situ grade control polygons as being representative of the ore boundaries. In FIG. 1, the exact same dataset was given to three ore control geologists at the same mine. There it is shown that they each had created different polygonal boundaries between material which is economically-profitable to process (ore) and sub-economic material (waste), subject to size and shape constraints. In many cases, these are not mathematically-optimized for value in situ.

A problem with the prior art methods, is that the three-dimensional post-blast shape of the resource is not taken into account. As shown in FIG. 2, the mine simply takes these polygons and slides them horizontally using movement data obtained with blast movement transmitters or physical movement markers, also known as Blast Vector Indicators placed within the blast volume prior to blasting. Even if the in-situ ore polygons are mathematically-optimized prior to the blast, the ore changes location and shape due to the explosive event.

What is needed is a method for creating grade control post-blast which accounts for the differential movement caused by the blast, swell caused by changed density of the rock after breakage, the post-blast density of rock contained in any grade control polygons, the geochemistry or attributes of any grade control polygons, the elevation change of flitches (horizontal slices of a single blast mined separately to allow for selective mining equipment), the mining direction, and the mining face angle. This creates enhanced efficiency in the mining operation of the resource deposit.

The current method uses actual movement vectors gathered in the blast in question or modelled movement vectors, then translates and re-blocks the in-situ grade control model. The current method optimizes grade control polygons for different mining face angles, on different flitches, and compares different digging directions.

BRIEF SUMMARY

It is therefore an object to provide a method for determining a post-blast shape of a resource in a muckpile to optimize grade control polygons for enhanced efficiency in the mining operation.

There is provided a 3D block modelling method of a resource boundary in a post-blast muckpile to optimize grade control polygons. The method comprises compiling pre-blast block model data and inputting the data into a processor module containing a memory module, identifying possible boundaries between process destinations and waste regions, inputting movement data into the memory module, inputting post-blast data into said memory module, generating a 3-D vector field, moving a plurality of centroids of a post-blast block model to populate a 3-D post blast location, and optimizing the populated 3-D post-blast location to determine a plurality of sets of optimal dig boundaries. The method further includes compiling pre-blast block model data including design blast hole layouts, loading plans and hole detonation firing times. Possible boundaries are identified by analysing samples from drill holes for geochemical properties. Geochemical properties and geostatistics are combined to construct an in-situ grade control model before blasting. Blast movement devices may be inserted within intended boundaries and locations are surveyed using a GPS survey device. Post blast movement is augmented with post-blast topographic survey data obtained from walking surveys, photogrammetry converted to a georeferenced point cloud, or by converting a LIDAR scan to a point cloud. Further, when blast movement is not monitored, movement is estimated by using a movement model, estimated movement distance, reference to a post blast topographic survey or reference to a model used to represent a post blast topographic survey. Pre-blast block model centroids are moved horizontally according to the horizontal movement measured or modelled, and the assumed horizontal movement between measured points in each movement horizon. Further, each pre-blast block model centroid, post-elevations of vectors derived from transmitters or devices measuring blast movement, and any geological data is moved vertically according to a mathematical relationship between a pre-blast surface and a post blast surface over a post-blast location of a vector. There is provided an in situ pre-blast model of a resource deposit in a blast volume to be mined, blast designs (including hole collars, explosive loading design, and detonation timing for each hole), pre and post movement data of an object located inside of the rock mass or on top of the rock mass (if available), and post-blast topographic data are input in to the memory of a general purpose computer or cloud storage. Using the pre-blast block model, blast design, movement data, and post-blast topographic data, a three-dimensional vector field is generated and displayed on a screen display. The method uses the three-dimensional vector field to move a plurality of centroids of the in-situ block model to populate a three-dimensional post-blast location. The method optimizes the populated three-dimensional post-blast model to determine a plurality of sets of optimal dig boundaries or desired delineations.

BRIEF DESCRIPTION OF THE DRAWINGS

One or more aspects of the present method are particularly pointed out and distinctly claimed as examples in the claims at the conclusion of the specification. The foregoing and other objects, features, and advantages are apparent from the following detailed description taken in conjunction with the accompanying drawings in which:

DETAILED DESCRIPTION

Figure 1:
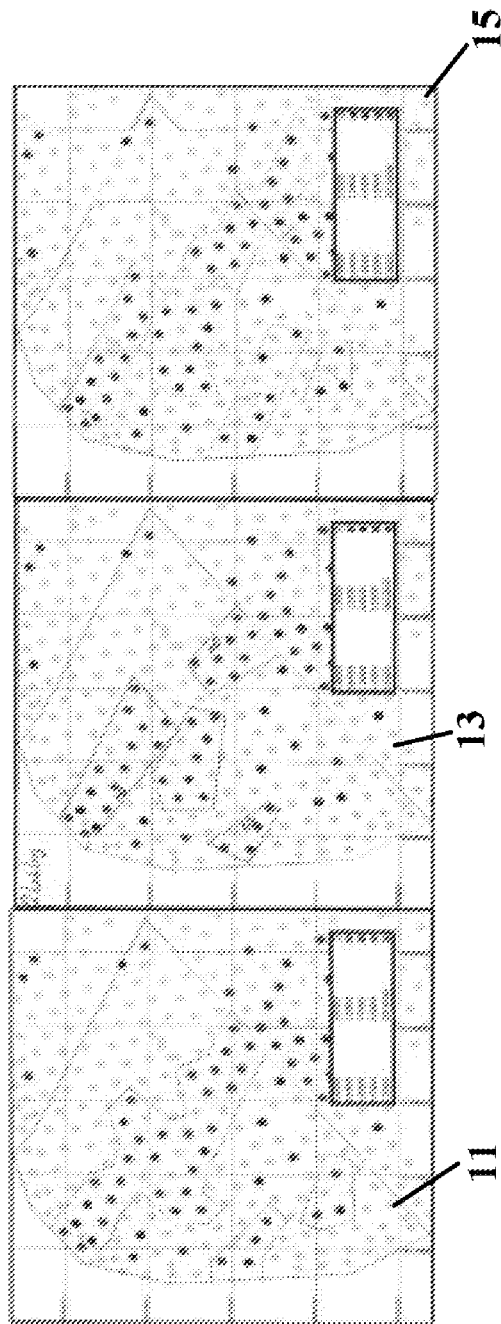
FIG. 1 is polygonal representation of the current 2D method for creating Ore/waste lines.

Although any methods and materials similar or equivalent to those described herein, can be used in the practice or testing of the present method, the preferred methods and materials are now described. Reference will now be made in detail, to the presently preferred embodiments of the method, including the examples of which are illustrated in the accompanying drawings. In the drawings, like numerals will be used in order to represent like features of the present method.

Unless specifically defined otherwise, all scientific and technical terms, used herein, have the same ordinary meaning as would be commonly understood by one of ordinary skill in the art to which this method belongs.

Figure 6:
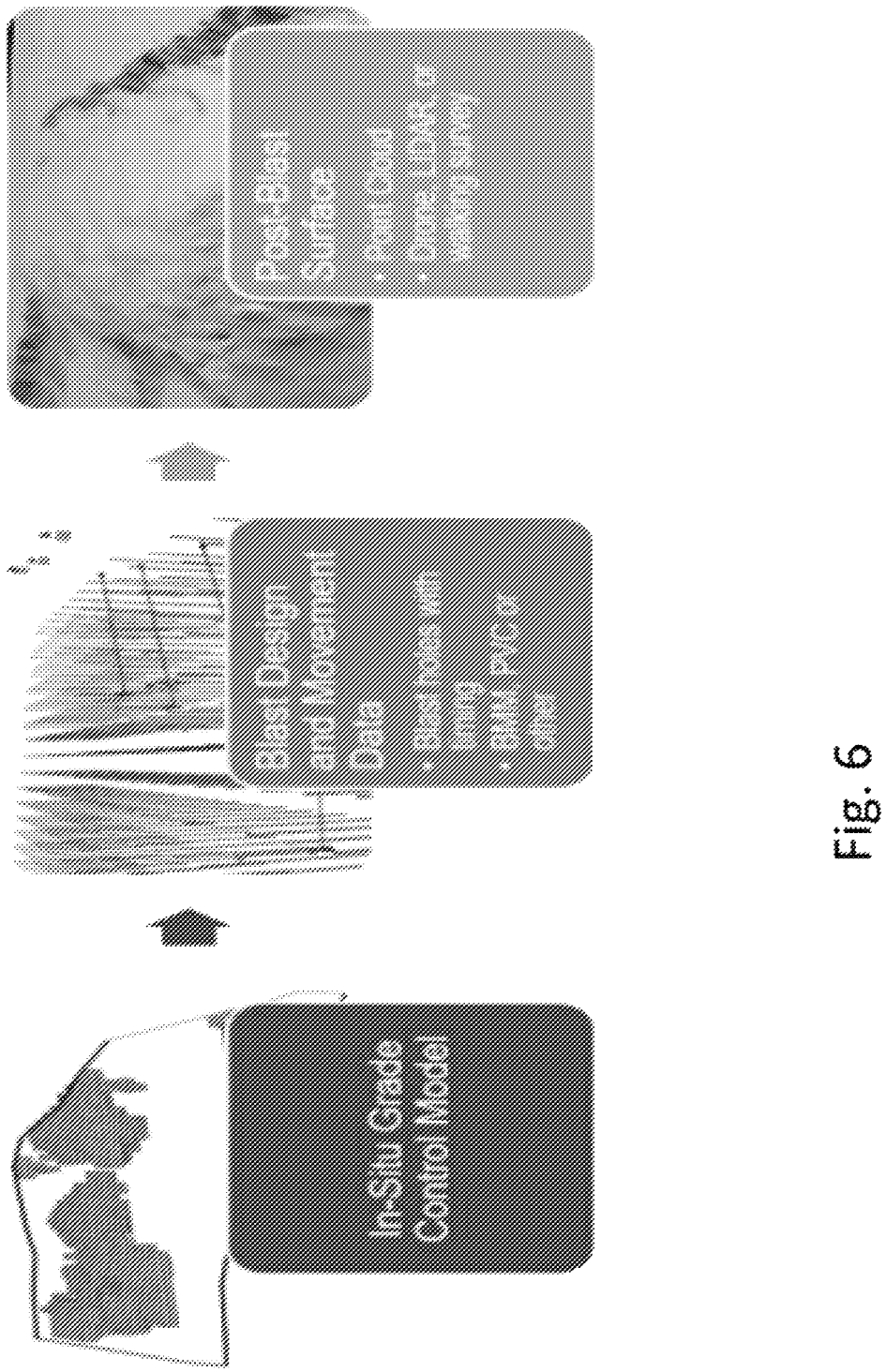
FIG. 6 is a flow chart illustration of the user input information flow, according to the present method.
Figure 7:
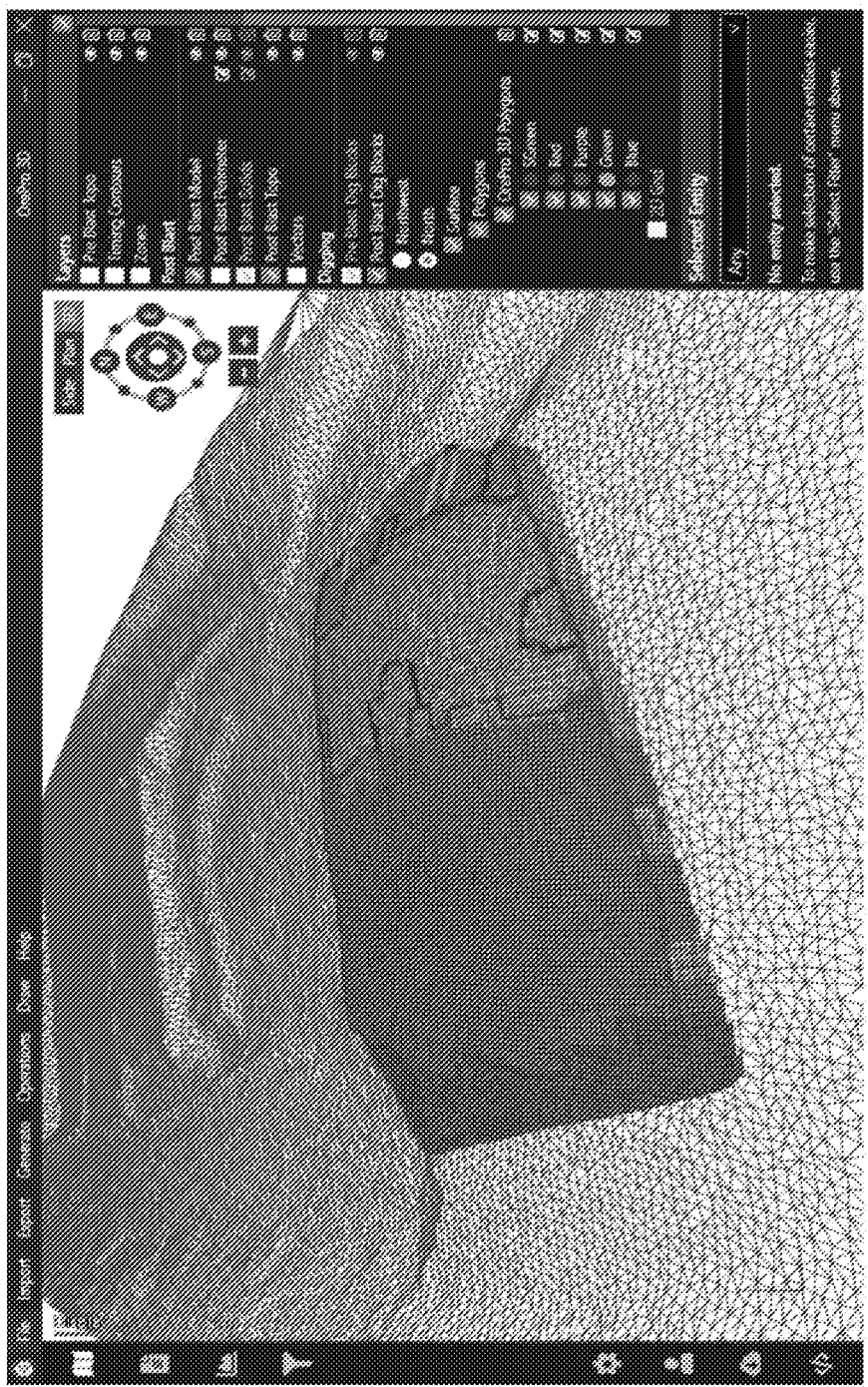
FIG. 7 is a screen shot of a current user interface according to the present method.

Referring now to FIG. 6, the 3-D block modelling method of a resource boundary in a post-blast muckpile to optimize desired delineation, for example, grade control polygons, is provided. An in-situ pre-blast model of a resource deposit in a blast volume to be mined, blast design information, movement data if available, and post-blast topographic data are input in to the memory of a general purpose computer. The foregoing being user-supplied information and formulas operative on the user-supplied information. The pre-blast block model is a centroid export with a grid and having attribute features. If the mine takes a single sample from a blast hole and lets it represent an entire flitch, this value is assumed to be a composite representing the full bench depth, unless other data is available.

Using the pre-blast block model, blast design information, movement data if available, and post-blast topographic data, a three-dimensional vector field is generated. The method uses the three-dimensional vector field to move a plurality of centroids of the in-situ block model to populate a three-dimensional post-blast location. The method optimizes the populated three-dimensional post-blast locations to determine a plurality of sets of optimal dig boundaries.

The pre-blast block model is a centroid export having variable grid spacing with attribute features. If the mine takes a single sample from a blast hole and lets it represent an entire flitch, this value is assumed to be a composite representing the full bench depth, unless other data is available. Generally, holes are drilled in an intended blast area, samples are recovered from the holes and analysed for geochemical properties. Geochemical properties and geostatistics are combined to construct an in-situ grade control model.

Blast design information which may include but is not limited to blast hole collars, blast timing data, hole size, hole spacing, hole depth which make up design blast hole layouts, powder factor, explosive loading height, and inert (stemming) loading height and at a minimum comprises X,Y,Z of the hole collars.

Movement data may include movement vectors. Measured movement vectors are input if available. Measured movement vectors are derived from any source which is well known in the mining art, including blast movement monitors or other types of transmitters, visually-identifiable products such as, but not limited to, PVC pipes, sand bags, chains, ropes, paint cans, providing an XYZ location pre-blast and at least XY position post-blast.

Figure 12:
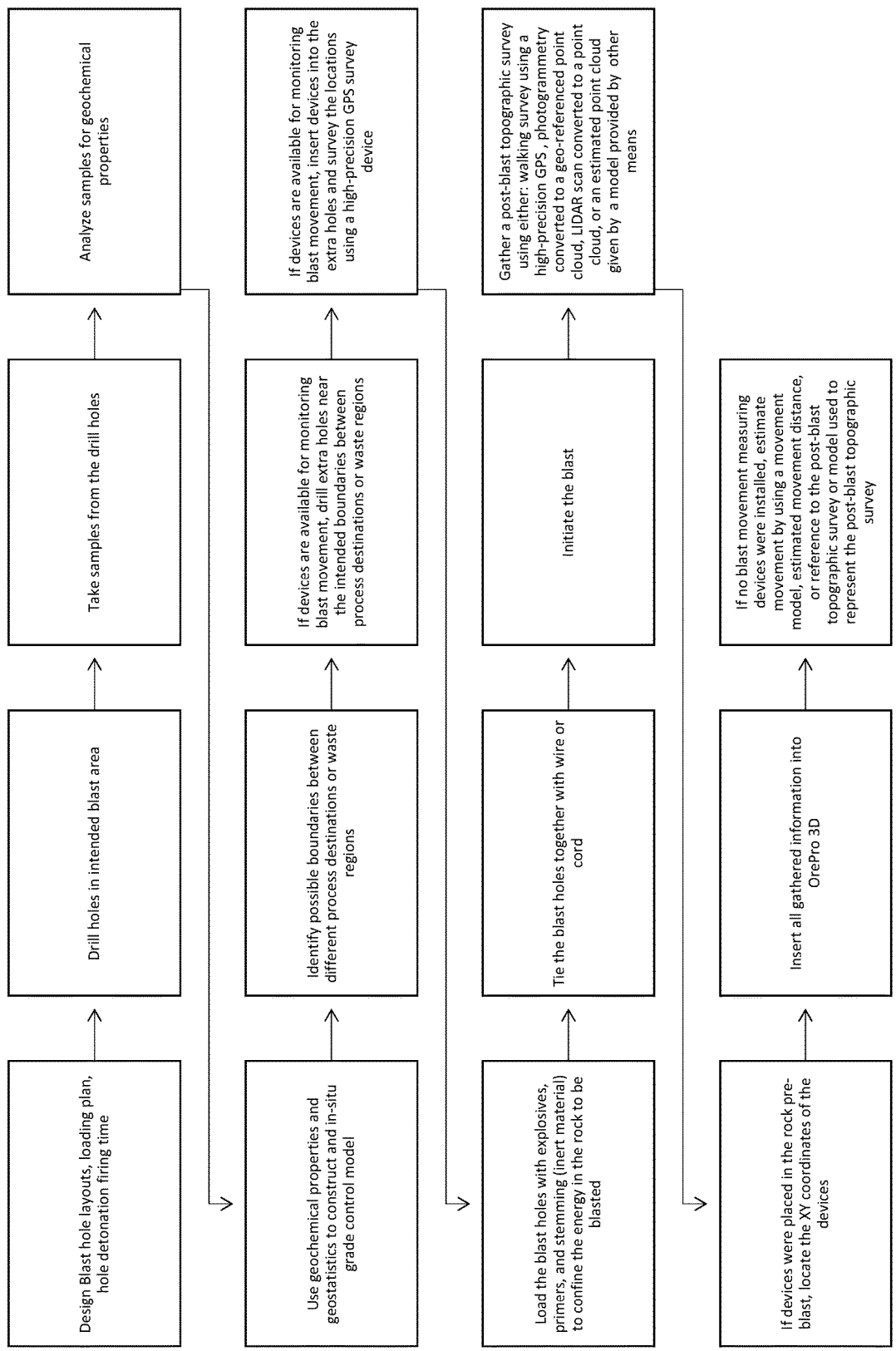
FIG. 12 shows a flow chart illustrating the current method.

Preferable are movement devices that provide $X_i, Y_i, Z_i$ (i=initial) and $X_f, Y_f$ (f=final). As set forth below and shown in FIG. 12 with $f$ as the function representing the relationship between swell or expansion of the in-situ rock to the post-blast density.

$$Depth_f = Depth_j * f\left(\frac{Height_f}{Height_j}\right)$$

$$Z_f = Z_b + Height_f - Depth_f$$

$$\therefore Z_f = Z_b + Height_f - Depth_i * f\left(\frac{Height_f}{Height_i}\right)$$

If measured movement vectors for the rock in the blast are not available, they are inferred from the blast design parameters and the post-blast topographic survey using relationships discovered by research.

It is unusual for a mining operation to have the time or resources to excavate transmitters after a blast to determine their depth post-blast. The current method allows for automatic calculation of the depth of the transmitter post-blast based on a mathematical relationship between the transmitter's starting depth and the post-blast surface elevation.

The relationship between the pre and post surface, allows for automatic calculation of the vertical trajectory of any point in the blast, to include any transmitter to monitor movement, pre blast block model centroids, and/or any structural information with a pre-blast XYZ location.

The post-blast topographic survey is input. The post-blast topographic survey may be performed by any method which is also well known in the art, including, without limitation, a walking visual survey of markers, LIDAR, photogrammetry converted to a geo-referenced point cloud, or a fly-over drone derived topographic map. The post-blast surface is a topographic survey in the form of a point cloud (X,Y,Z) and may be actual or modelled.

Figure 2:
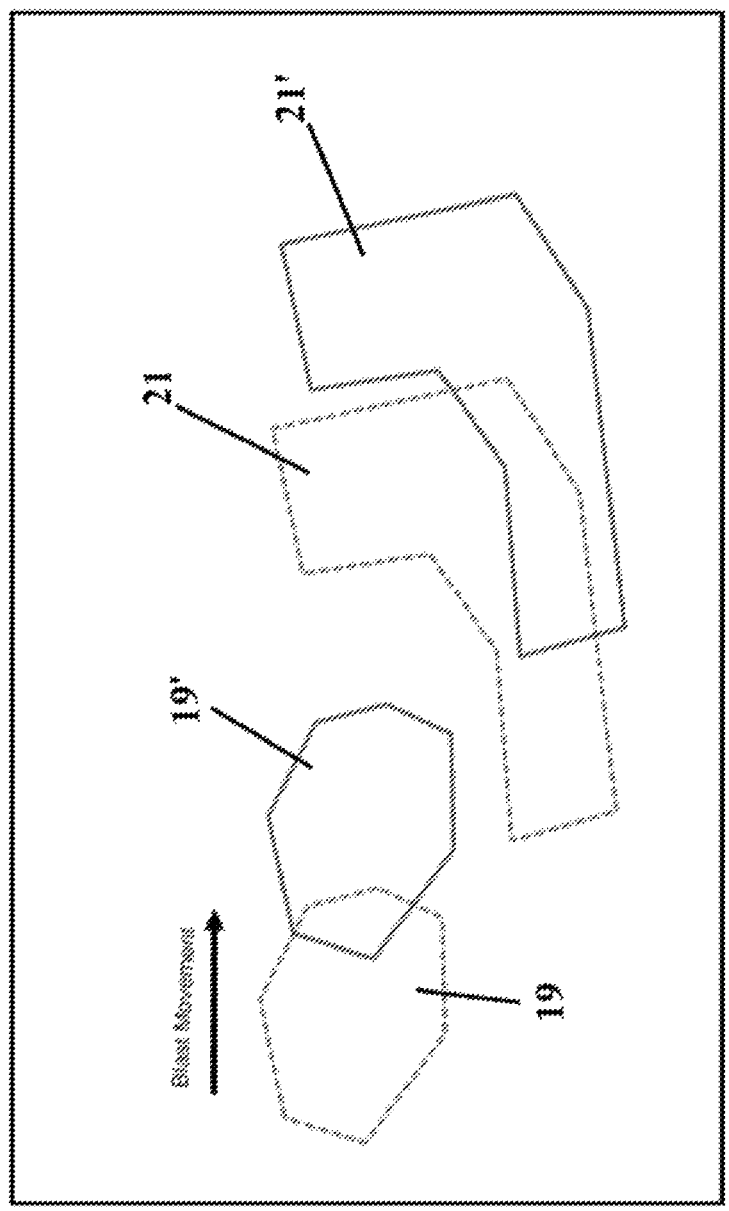
FIG. 2 is a graphical representation of the current 2D method for translating pre-blast ore/waste lines into post-blast representations of the ore/waste lines.
Figure 3:
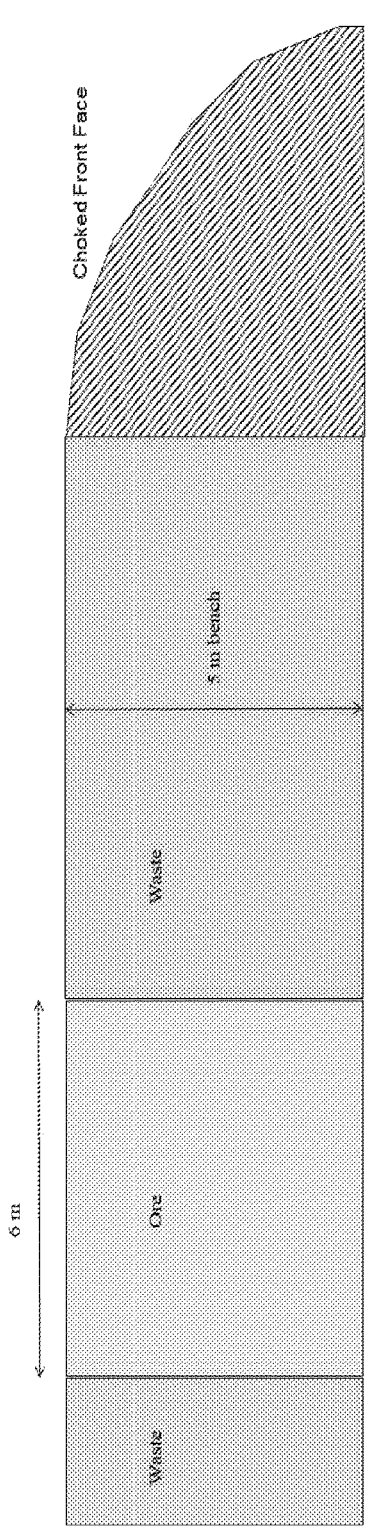
FIG. 3 shows a cross-sectional representation of a real blast with real movement vectors.
Figure 3:
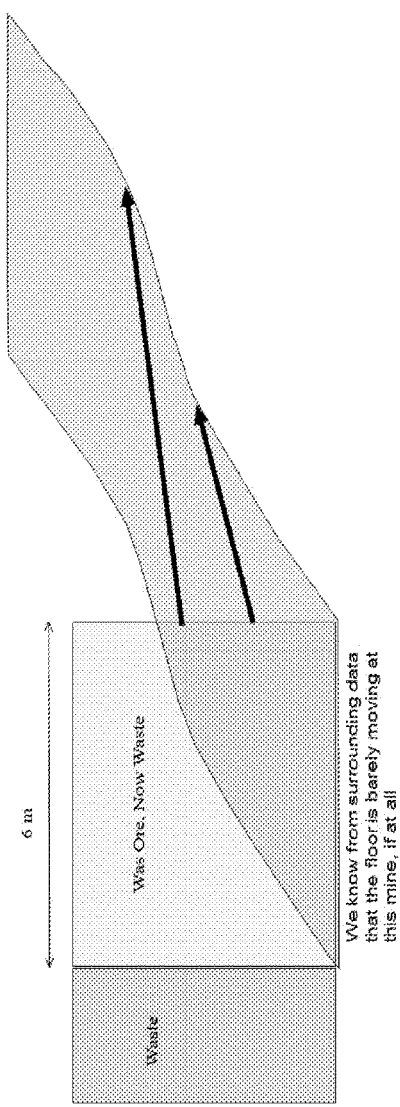
Figure 4:
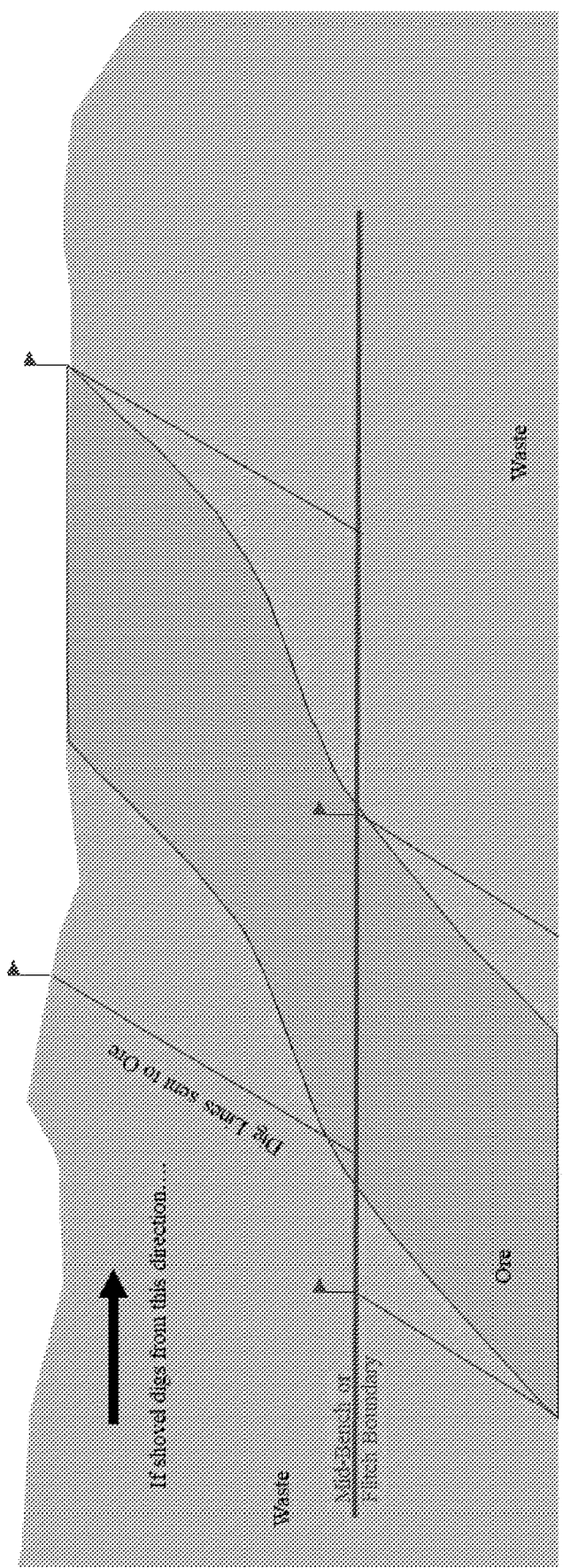
FIG. 4 is a sectional view of a first option for dig line location.
Figure 5:
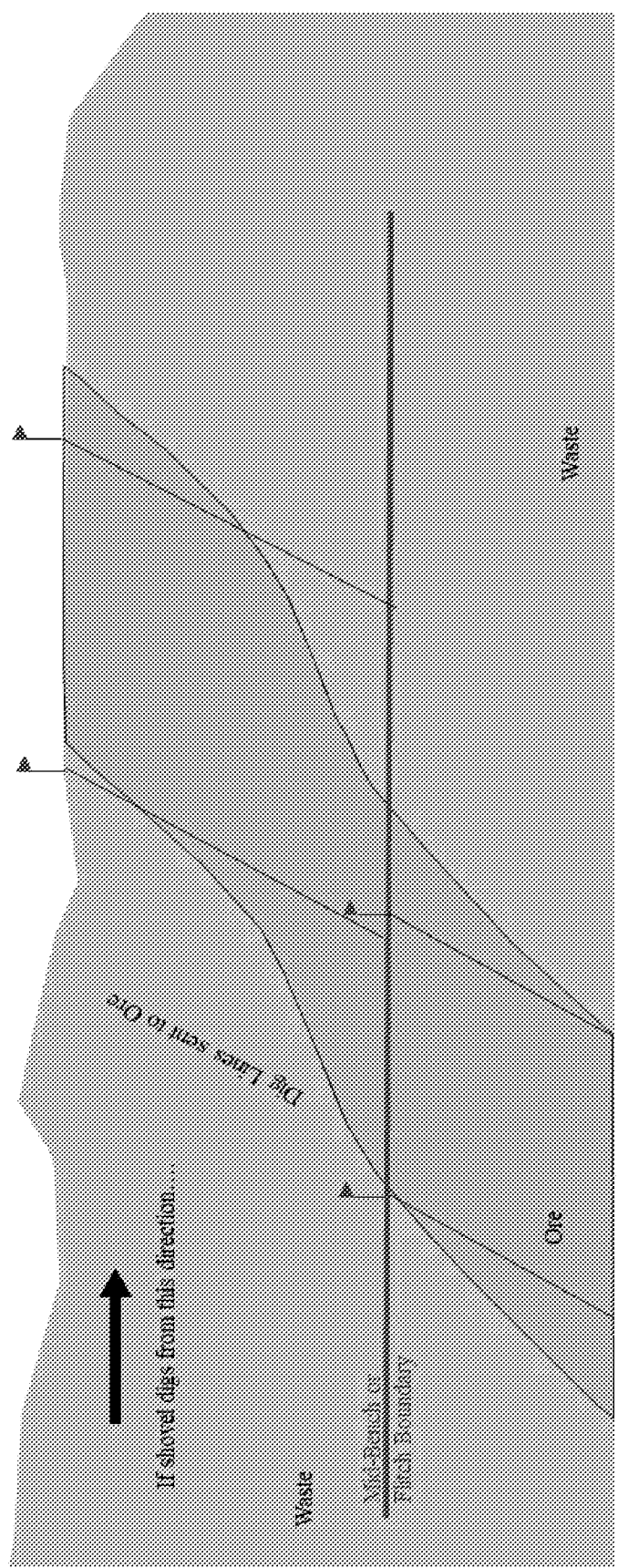
FIG. 5 is a sectional view of a second option for dig line location.

Referring now to FIGS. 1-5, there is shown the prior art method of creating 2-D polygons pre-blast. The exact same dataset is provided to three ore control geologists and the results at 11, 13 and 15 show three different results. As a result, the subjective polygon selection leaves open opportunities for improvement. FIG. 2 demonstrates how the polygons 19, 21 are moved horizontally with blast movement at 19' and 21'. FIG. 3 demonstrates a real case of narrow vein blast movement in views 1-4. View 2 shows the lack of movement of the floor and view 4 demonstrates the consequences of the prior art practice with the ore loss and dilution.

As demonstrated, ore polygons are rarely optimized in-situ and ore control is not optimized in the post-blast state by moving in-situ polygons. Swell, differential movement vertically and horizontally change the location of the valuable material. Finally, a processor can perform the necessary calculations needed to optimize ore control in 3-D. Swell is calculated by using the increase in volume pre-to-post, thereby providing the mass of rock contained inside a grade control polygon.

dependent upon timing, blast design, bench height, and the zone of the blast where the movement knowledge is desired.

Figure 8:
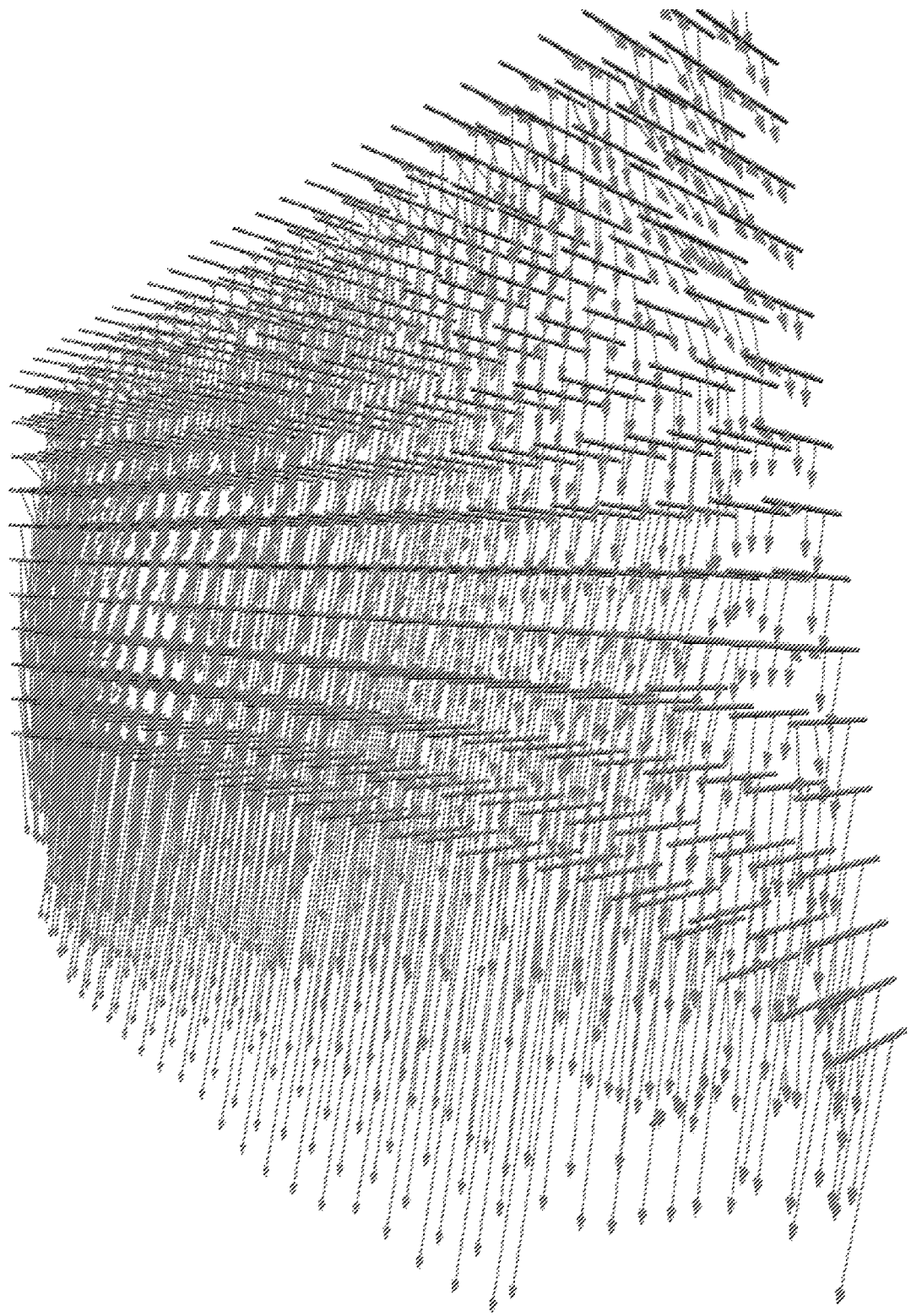
FIG. 8 is a cross section of the 3-D vector field being generated, according to the present method.

It isn't currently possible for mines to collect hundreds of movement data points in the blast, as they are expensive, time-consuming to install, and there are currently hindrances to the proximity that transmitters can be placed to each other. As illustrated in FIG. 8, the present method uses whatever movement information one is able to gather, then it 'fills in the blanks' with vectors based on research and observation. It is also, specifically contemplated herein, that, in the alternative, these vectors will be populated using artificial intelligence, simulating what a blast movement expert can provide in an instant.

The movement vector field is vertically-created based on research demonstrating deterministic variation at depth in the blast, caused by the blast design, and inferred based on the blast design information entered.

Figure 9:
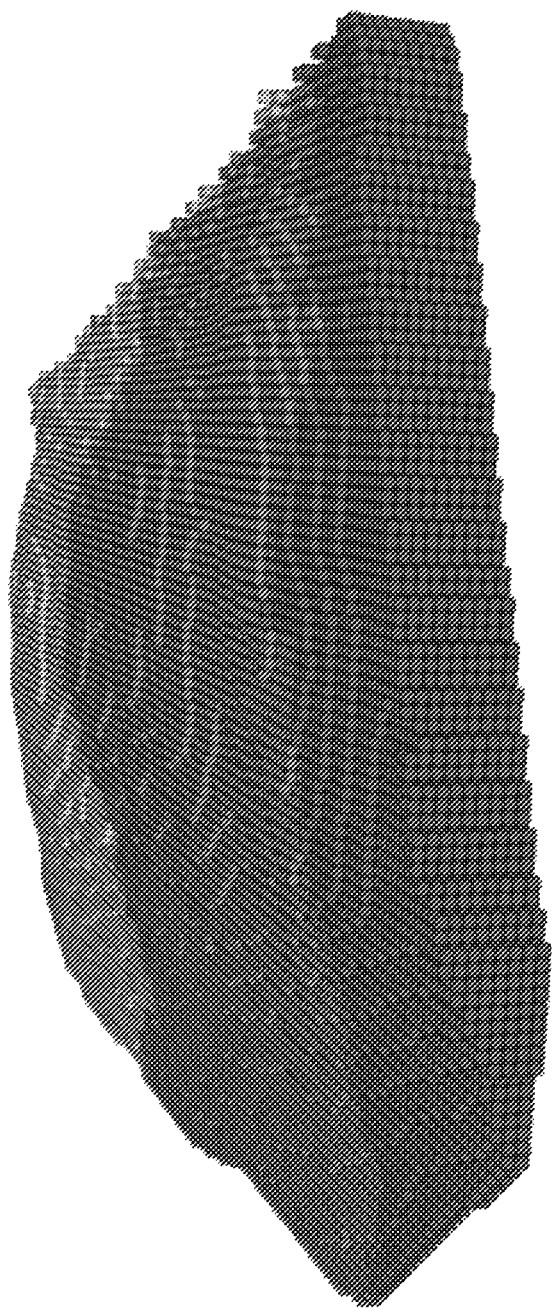
FIG. 9 shows the post-blast model generated with the present method.
Figure 10:
FIG. 10 shows a graphical representation of the differential movement at different depths.
Figure 11:
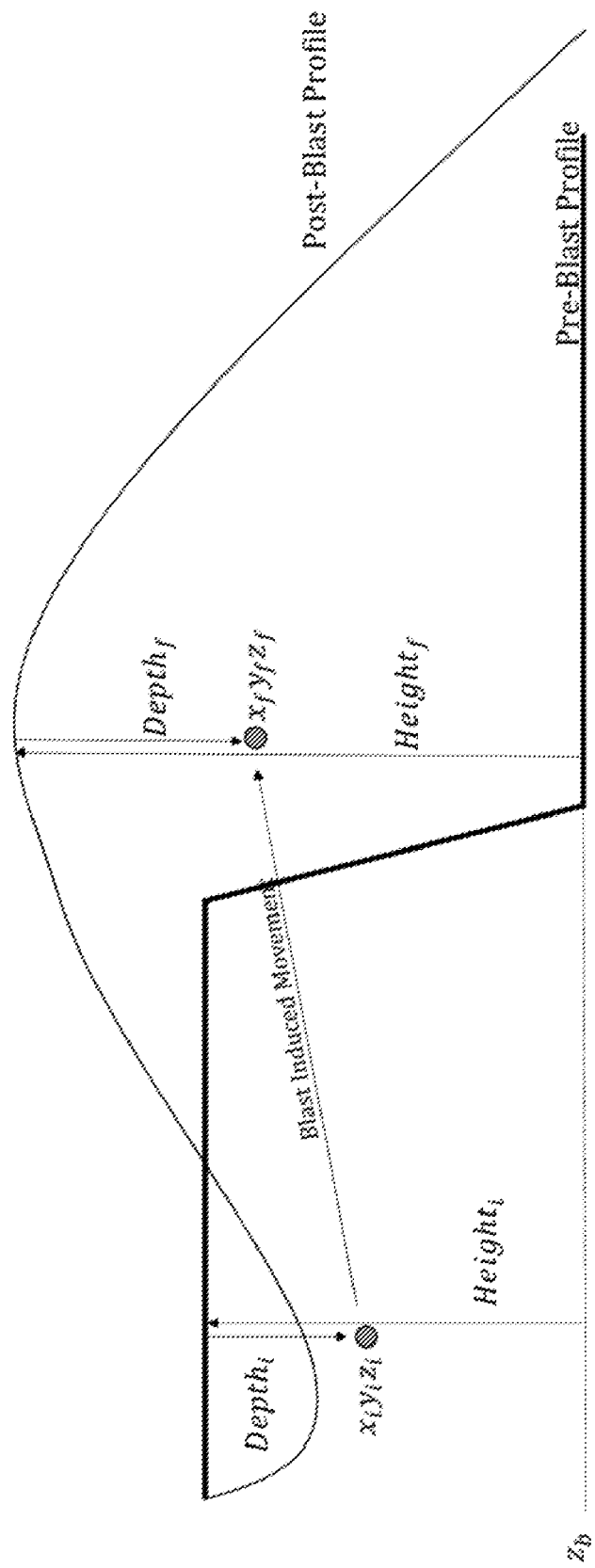
FIG. 11 shows a graph of calculations for movement vectors.

Turning now to FIG. 9, after creating the 3D vector field, the present method allows the user to edit the movement profile at any given location. This allows the user to make changes based on the topographic survey, misfires, or any other credible observation as required.

After the vector field is created, the in-situ block model centroids are moved into their post-blast location. As shown in FIG. 9 and referenced in flow chart (FIG. 12), a post-blast model, with dimensions varying based on requirements is created, and populated with the moved centroids of the pre-blast block model.

As shown in the example of Table 1, the results are summarized in a chart, and dig boundaries snapped to the top of the muck pile, or the desired tops of each flitch are provided for whichever mining direction is selected.

TABLE 1

| | | | | | | | | | |
|---|---|---|---|---|---|---|---|---|---|
| Blast 402 | | | | | | | | | |
| Flitch | Heading Direction | Volume | Swelled SG | Tonnes | g/t | Grams | Troy Ounces | Oz Recov | Recovered $ |
| Bottom | S | 3570 | 1.9 | 6733 | 1.52 | 10219 | 328.6 | 305.6 | $381,940 |
| Bottom | N | 3480 | 1.9 | 6563 | 1.49 | 9808 | 315.3 | 293.3 | $366,567 |
| Bottom | W | 3519 | 1.9 | 6637 | 1.55 | 10319 | 331.7 | 308.5 | $385,657 |
| Bottom | E | 3444 | 1.9 | 6495 | 1.53 | 9915 | 318.8 | 296.5 | $370,570 |
| Top | S | 4273 | 1.9 | 8059 | 1.60 | 12894 | 414.5 | 385.5 | $481,901 |
| Top | N | 4418 | 1.9 | 8332 | 1.55 | 12927 | 415.6 | 386.5 | $483,153 |
| Top | W | 4155 | 1.9 | 7836 | 1.60 | 12530 | 402.8 | 374.6 | $468,300 |
| Top | E | 4263 | 1.9 | 8040 | 1.60 | 12863 | 413.6 | 384.6 | $480,773 |

The present method allows the user to make edits of the vector field relative to the in-situ pre-blast model of an ore deposit in a blast volume to be mined, movement data, and post-blast topographic input data. The present method includes novel tools to assist the user to edit the vector field using the topographical survey and surrounding vectors, in addition to the zone of the blast in question.

Referring again to FIG. 2, as the user is making edits to any vector, the vertical trajectory of the vector is automatically calculated based on the mathematical relationship of the pre and post surfaces over the starting and ending points of the vector. These edits are then incorporated into construction of a three-dimensional vector field.

Moreover, it is generally accepted knowledge, to persons of skill in the art, that different areas of the blast behave differently. As shown in FIG. 8, a cross section of the 3-D vector field being generated, the differences in behaviour are As referenced above, a computer system to implement the modeling approach disclosed herein, may comprise one or more processors, a network interface, a memory, a media interface and an optional display. The network interface allows the computer system to connect to a network, while the media interface allows the computer system to interact with media, such as a hard drive or removable media. Further, the method contemplates remote hosting and access through cloud storage.

As explained further below, the methods disclosed herein may be distributed as an article of manufacture that itself comprises a machine-readable medium containing one or more programs, which when executing, implement embodiments of the present method. For instance, the machine-readable medium may contain a program configured to build a 3D block modelling method of an ore boundary in a post-blast muckpile to optimize grade control polygons.

The machine-readable medium may be a recordable medium (e.g., floppy disk, hard drive, optical disk, memory cards, etc.) or may be a transmission medium (e.g., a network comprising fiber optics, the world-wide web, cables, or a wireless channel using time-division multiple access, code-division multiple access, or other radio-frequency channel). Any medium known or developed that can store information suitable for use with a computer system may be used. In one embodiment, the machine-readable medium comprises a non-transitory, computer-readable storage device.

The processor can be configured to implement the methods, steps and functions disclosed herein. The memory can be distributed or local, and the processor can be distributed or singular.

The memory module could be implemented as an electrical, magnetic or optical memory, or any combination of these or other types of storage devices. Moreover, the term "memory" should be construed broadly enough to encompass any information able to be read from, or written to, an address in an addressable space accessible by the processor. With this definition, information on a network, accessible through the network interface, is within the memory because the processor can retrieve the information from the network. It should be noted that each distributed processor that makes up the one or more processors generally contains its own addressable memory space. It should also be noted that some or all of the computer system or computing environment can be incorporated into an application specific or general-use integrated circuit.

As will be appreciated by one skilled in the art, aspects of the present method may be embodied as a system, method or computer program product. Accordingly, aspects of the present method may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, aspects of the present method may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable signal medium may include a propagated data signal with computer readable program code embodied therein, for example, in baseband or as part of a carrier wave. Such a propagated signal may take any of a variety of forms, including, but not limited to, electro-magnetic, optical or any suitable combination thereof. A computer readable signal medium may be any computer readable medium that is not a computer readable storage medium and that can communicate, propagate, or transport a program for use by or in connection with an instruction execution system, apparatus or device.

A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer program product includes, for instance, one or more computer readable storage media to store computer readable program code means or logic thereon to provide and facilitate one or more aspects of the present method.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present method may be written in any combination of one or more programming languages, suitable for either one of 2D or 3D modeling which are well known in the modeling art. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present method are described herein with reference to flowchart illustrations and/or block diagrams of methods, apparatus (systems) and computer program products according to embodiments of the method. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present method. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more aspects of the present method may be provided, offered, deployed, managed, serviced, etc. by a service provider who offers management of customer environments. For instance, the service provider can create, maintain, support, etc. computer code and/or a computer infrastructure that performs one or more aspects of the present method for one or more customers. In return, the service provider may receive payment from the customer under a subscription and/or fee agreement, as examples. Additionally or alternatively, the service provider may receive payment from the sale of advertising content to one or more third parties.

In one aspect of the present method, an application may be deployed for performing one or more aspects of the present method. As one example, the deploying of an application comprises providing computer infrastructure operable to perform one or more aspects of the present method.

As a further aspect of the present method, a computing infrastructure may be deployed comprising integrating computer readable code into a computing system, in which the code in combination with the computing system is capable of performing one or more aspects of the present method.

As yet a further aspect of the present method, a process for integrating computing infrastructure comprising integrating computer readable code into a computer system may be provided. The computer system comprises a computer readable medium, in which the computer medium comprises one or more aspects of the present method. The code in combination with the computer system is capable of performing one or more aspects of the present method.

Further, other types of computing environments can benefit from one or more aspects of the present method. As an example, an environment may include an emulator (e.g., software or other emulation mechanisms), in which a particular architecture (including, for instance, instruction execution, architected functions, such as address translation, and architected registers) or a subset thereof is emulated (e.g., on a native computer system having a processor and memory). In such an environment, one or more emulation functions of the emulator can implement one or more aspects of the present method, even though a computer executing the emulator may have a different architecture than the capabilities being emulated. As one example, in emulation mode, the specific instruction or operation being emulated is decoded, and an appropriate emulation function is built to implement the individual instruction or operation.

In an emulation environment, a host computer includes, for instance, a memory to store instructions and data; an instruction fetch unit to fetch instructions from memory and to optionally, provide local buffering for the fetched instruction; an instruction decode unit to receive the fetched instructions and to determine the type of instructions that have been fetched; and an instruction execution unit to execute the instructions. Execution may include loading data into a register from memory; storing data back to memory from a register; or performing some type of arithmetic or logical operation, as determined by the decode unit. In one example, each unit is implemented in software. For instance, the operations being performed by the units are implemented as one or more subroutines within emulator software.

Further, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the method. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

While, the present method has been described in connection with the preferred and illustrated embodiments, it will be appreciated and is understood that certain modifications may be made to the present method without departing from the true spirit and scope.

We claim:
1. A method for 3-D block modelling of a resource boundary in a post-blast muckpile to optimize desired delineation for resource control, the method comprising the steps of:
   compiling pre-blast block model data and inputting said data into a memory module;
   inputting a blast design into said memory module;
   inputting post-blast data into said memory module;

generating a 3-D vector field based on the inputted data, including generating the 3-D vector field based on the pre-blast block model data, the blast design and the post-blast data;
moving a plurality of pre-blast block model centroids, based on the 3-D vector field, to populate a 3-D post-blast model; and
using said populated 3-D post-blast model to determine a plurality of sets of optimal dig boundaries.

2. The method according to claim 1 wherein said step of inputting the blast design includes inputting data selected from the group consisting of design blast hole layouts, loading plans and hole detonation firing times.

3. The method according to claim 1 including identifying possible boundaries between process destinations and waste regions includes analysing samples from drill holes for geochemical properties.

4. The method according to claim 3 wherein said geochemical properties and geostatistics are combined to construct an in-situ grade control model.

5. The method according to claim 1 further including inserting blast movement devices within intended boundaries and surveying said locations using a GPS survey device.

6. The method according to claim 1 wherein the post-blast data include post-blast topographic survey data gathered with photogrammetry and converted to a geo-referenced point cloud.

7. The method according to claim 1 wherein the post-blast data include a LIDAR scan converted to a point cloud.

8. The method according to claim 1 wherein the post-blast data include a point cloud estimated based upon a provided model.

9. The method according to claim 1 further including estimating movement by using data selected from the group consisting of a movement model, estimated movement distance, reference to a post blast topographic survey or reference to a model used to represent a post blast topographic survey.

10. The method according to claim 1 wherein said step of moving a plurality of centroids includes moving each pre-blast block model centroid horizontally according to a measured horizontal movement and an assumed horizontal movement between measured points in each movement horizon.

11. The method according to claim 1 wherein said step of moving a plurality of centroids includes analysing and inputting post-blast elevations of vectors derived from transmitters or devices measuring blast movement, and/or from any geological data, vertically according to a mathematical relationship between a pre-blast surface and a post-blast surface over a post-blast location of a vector.

12. A method for 3-D block modelling of a resource in a post-blast muckpile to optimize grade control polygons for ore control, comprising:
inputting an in-situ pre-blast block model;
inputting post-blast topographic data;
inputting blast data selected from the group consisting of a blast design, explosive loading data, and hole detonation firing time;
combining said pre-blast block model, said blast data, and said post-blast topographic data to generate a three-dimensional vector field;
moving a plurality of pre-blast block model centroids to populate a three-dimensional post-blast model based on the three-dimensional vector field; and
using said populated three-dimensional post-blast model to determine a plurality of sets of optimal dig boundaries based upon said grade control polygons.

13. The method according to claim 12 wherein said step of determining a plurality of sets of optimal dig boundaries includes the step of using post-blast swell data to calculate the volume and the density of rock contained inside said grade control polygon.

14. The method according to claim 13 wherein said steps further include considering a mining face angle in optimizing grade control polygons.

15. The method according to claim 12 wherein said steps further include editing a movement profile based on topographic survey data or observation data.

16. The method according to claim 12 wherein said steps further include analysing and inputting post-elevations of vectors derived from transmitters or devices measuring blast movement.

17. The method according to claim 16 wherein said post-elevations of vectors are further derived from vertical geological data according to a mathematical relationship between a pre-blast surface and a post blast surface over a post-blast location of a vector.

18. A method of optimizing grade control polygons in a post-blast muckpile, comprising, with
a memory module coupled to a computer processor configured to store in-situ pre-blast block model information, and
a processor module coupled to a computer configured to generate a 3-D vector field:
determining in-situ pre-blast parameters and inputting said parameters into said memory module, wherein the parameters include at least a blast design;
gathering post-blast topographic survey data and inputting said data into said memory module;
generating movement vector field data representing the 3-D vector field with said processor module based on the pre-blast block model information, the blast design and the post-blast topographic survey data; and
using said vector field data to determine optimal dig boundaries with said grade control polygons.

19. In an electronic system for storing and manipulating information, a computer implemented method of representing a three-dimensional post-blast block model of a resource on a screen display, the method comprising:
displaying on said screen display optimal dig boundaries in said post-blast block model;
said dig boundaries comprising stored data, at least some of said data comprising user-supplied information and formulas operative on said user-supplied information to generate a three-dimensional vector field;
said user supplied information comprising a plurality of centroids arranged horizontally according to a measured horizontal movement and an assumed horizontal movement between measured points;
said user-supplied information further comprising pre-blast block model data, blast design information and post-blast topographic data used to generate said three-dimensional vector field; and
said blast design information comprising design blast hole layouts, loading plans and hole detonation firing times.

20. The method according to claim 1 wherein the post blast data include movement data.

* * * * *